United States Patent
Kappel et al.

(10) Patent No.: US 6,779,256 B2
(45) Date of Patent: Aug. 24, 2004

(54) INTERPOSER EXTRACTION TOOL

(75) Inventors: Mark A. Kappel, Brookfield, WI (US); Robert J. Augustyn, Pewaukee, WI (US); Joseph J. Lacey, Cambridge, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 10/064,147

(22) Filed: Jun. 14, 2002

(65) Prior Publication Data

US 2003/0229979 A1 Dec. 18, 2003

(51) Int. Cl.[7] .............................................. B23P 19/00
(52) U.S. Cl. ....................... 29/764; 29/426.1; 29/426.5; 29/426.6; 29/762; 29/278
(58) Field of Search .............................. 29/426.1, 426.5, 29/426.6, 762, 764, 278

(56) References Cited

U.S. PATENT DOCUMENTS

| | | | | |
|---|---|---|---|---|
| 5,193,269 A | * | 3/1993 | Dattilo .......................... | 29/764 |
| 5,230,143 A | * | 7/1993 | Karlovich ..................... | 29/764 |
| 5,365,653 A | * | 11/1994 | Padrun ......................... | 29/741 |
| 5,473,816 A | * | 12/1995 | Harden et al. ................ | 29/876 |
| 5,479,669 A | * | 1/1996 | Chen ............................ | 7/107 |
| 5,502,887 A | * | 4/1996 | Gonzales ..................... | 29/764 |
| 6,018,867 A | * | 2/2000 | Boe ............................. | 29/762 |
| 6,249,960 B1 | * | 6/2001 | Faesel ......................... | 29/762 |
| 2003/0229985 A1 | * | 12/2003 | Kappel et al. ................ | 29/842 |

* cited by examiner

*Primary Examiner*—Essama Omgba
(74) *Attorney, Agent, or Firm*—Peter J. Vogel

(57) ABSTRACT

A tool is provided for separating a first circuit board and a second circuit board to prevent the damage thereof. The tool includes a piston assembly and a handle. A first blade and second blade are coupled between the handle and the piston assembly. The first blade and the second blade are normally biased outwardly. The handle has a first position and a second position relative to the piston assembly. In the first position the blades are biased outwardly and in the second position the piston assembly biases the blades inwardly to engage the first circuit board.

5 Claims, 6 Drawing Sheets

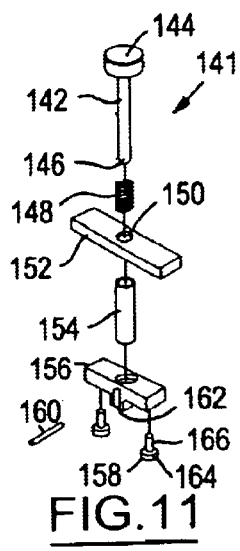
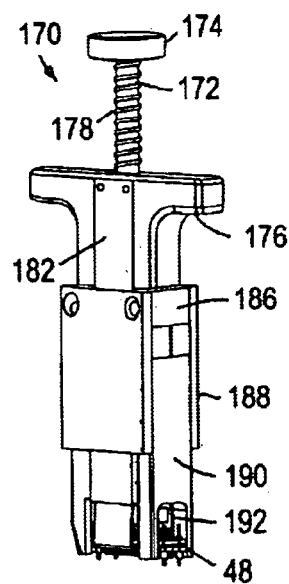
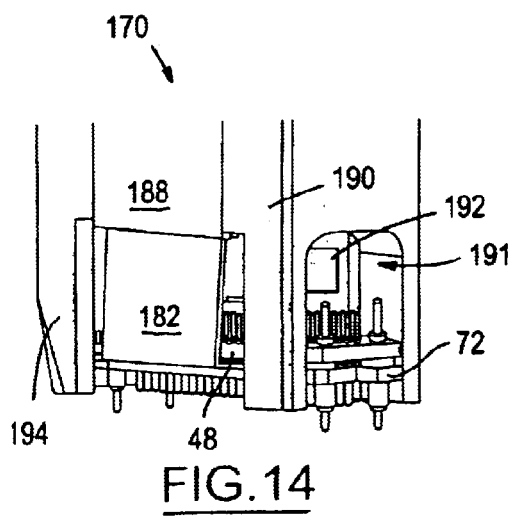
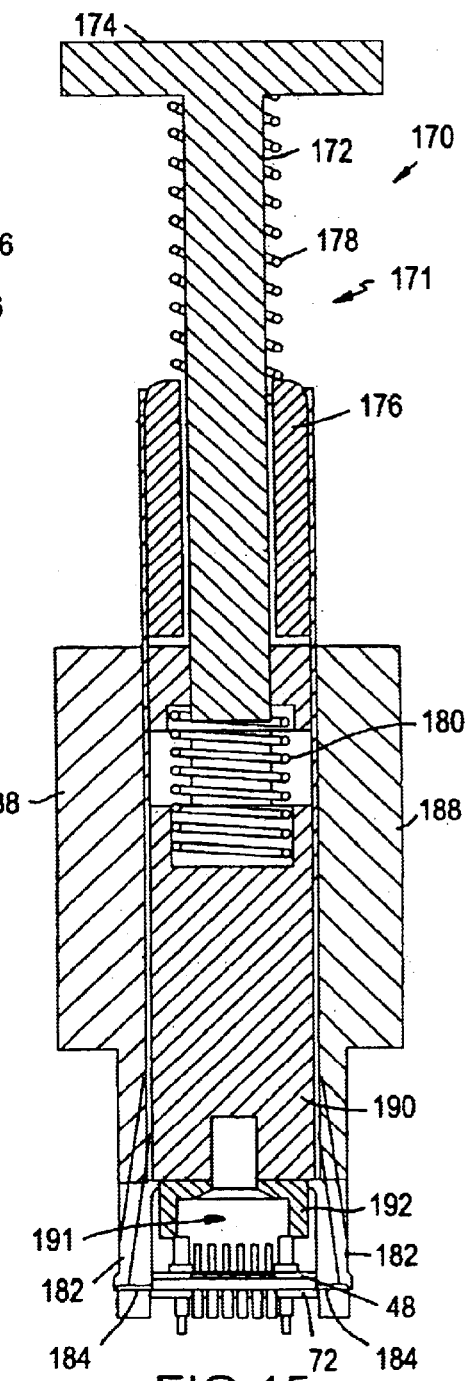

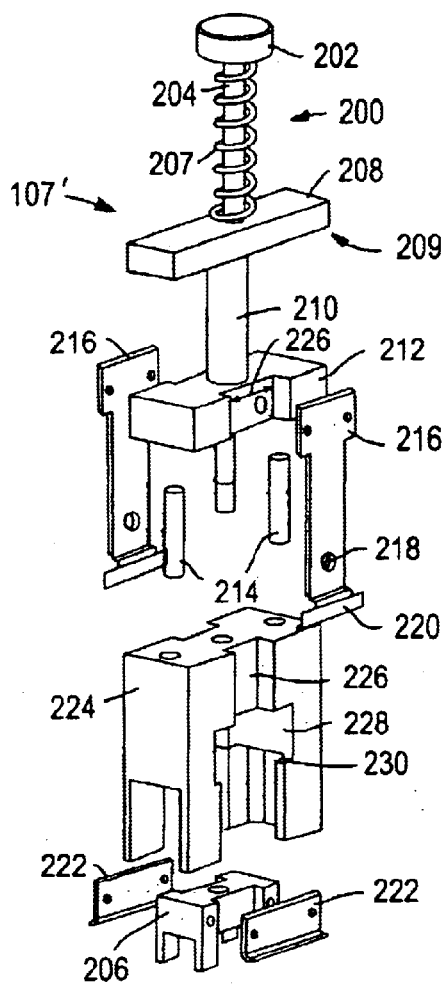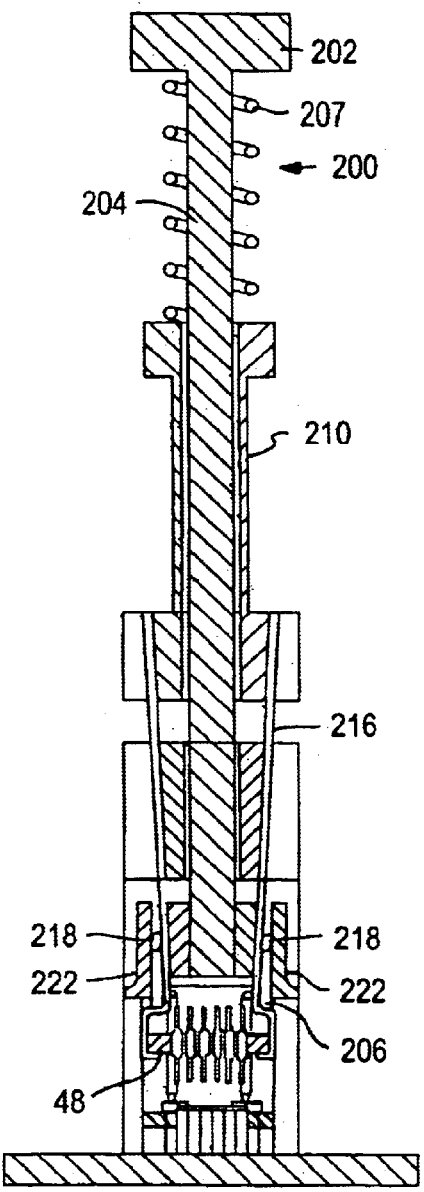
FIG.16
FIG.17

INTERPOSER EXTRACTION TOOL

CROSS REFERENCE TO RELATED APPLICATIONS

The present invention is related to application Ser. Nos. 10/064,131 entitled "Connector Housing Retainer", 10/064,145 entitled "Electrostatic Discharge Protective Boot For A Connector", 10/064,146 entitled "Electrical Connector Extraction Tool", and 10/064,148 entitled "Protective Housing For A High Density Electrical Connector", filed simultaneously herewith and incorporated by reference herein.

BACKGROUND OF INVENTION

The present invention relates generally to electrical connectors, and more particularly, to a tool to assist in the removal of an interposer to prevent damage thereto.

Electrical connections for various types of systems are commonly located in hard to reach and compact locations. One example of such a device is a computed tomography (CT) device. Computed tomography systems are complex systems that include a number of detectors that are electrically coupled to a data acquisition system. The detectors utilize a flex circuit that is electrically connected to a data acquisition circuit board through the use of a connector. During the manufacturing and servicing processes, the connection between the connector and the data acquisition system must be disconnected. Several detectors and thus several electrical connections exist. These connections are often located in a difficult to reach area.

The data acquisition system is a densely populated circuit board and thus has a number of components and a great number of traces. Locating a number of connectors which are relatively large is difficult. Also, electrostatic discharge can easily damage the circuitry. Electrostatic discharge may build inside the flex connector. Because a number of pins are used to connect the flex connector and the data acquisition system, the removal of the flex connector portion must be performed without bending the interconnection pins.

It would therefore be desirable to provide an extraction tool for an interposer within electrical connection to prevent the bending of the electrical connections during removal.

SUMMARY OF INVENTION

The present invention provides a tool for separating a first circuit board and a second circuit board to prevent the damage thereof. In one aspect of the invention the tool includes a piston assembly and a handle. A first blade and second blade are coupled between the handle and the piston assembly. The first blade and the second blade are normally biased outwardly. The handle has a first position and a second position relative to the piston assembly. In the first position the blades are biased outwardly and in the second position the piston assembly biases the blades inwardly to engage the first circuit board.

In a further aspect of the invention the motion of the handle causes the blades to not only move inwardly but to move upwardly as well away from the second circuit board. This motion, advantageously, causes the first circuit board to be retained against a channel to prevent the first circuit board from falling out of the tool. This prevents the first circuit board from reaching an undesirable position that may cause damage to the equipment to which the circuit boards are attached.

Other aspects and advantages of the present invention will become apparent upon the following detailed description and appended claims, and upon reference to the accompanying drawings.

BRIEF DESCRIPTION OF DRAWINGS

FIG. 11 is an exploded view of the extraction tool according to the present invention.

FIG. 13 is a perspective view of the interposer extraction tool according to the present invention.

FIG. 14 is a perspective view of the interposer extraction tool removing an interposer according to the present invention.

FIG. 15 is a cross-sectional view of the interposer extraction tool of FIGS. 13 and 14.

FIG. 16 is a perspective view of the interposer extraction tool of FIGS. 13 and 14.

FIG. 17 is a cross-sectional view of the second embodiment of the extraction tool according to the present invention.

DETAILED DESCRIPTION

Figure 1:
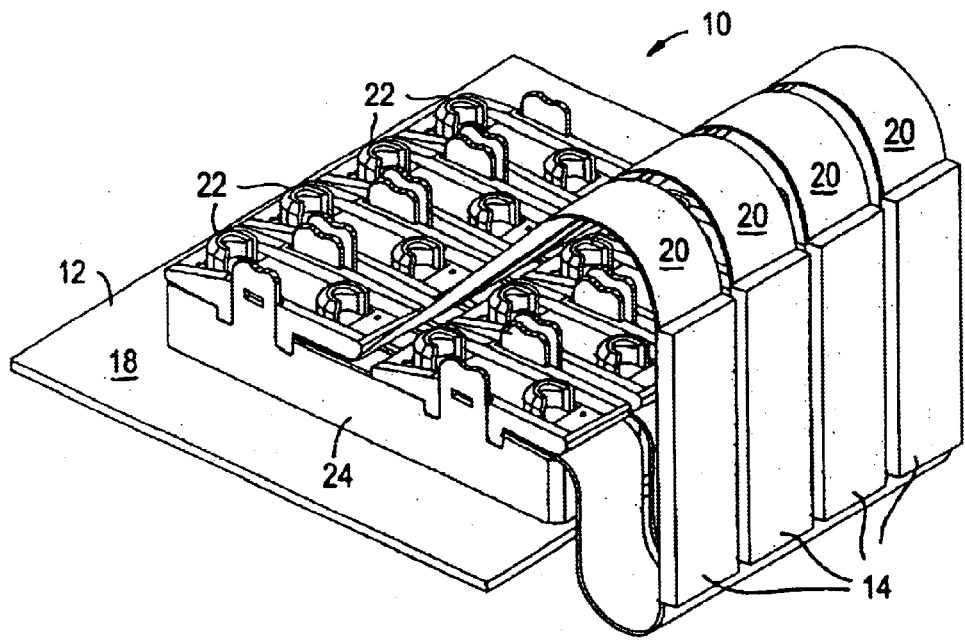
FIG. 1 is a perspective view of a data acquisition system circuit board coupled to a plurality of detector module circuits.

In the following figures the same reference numerals will be used to illustrate the same components in the various views. The present invention is described with respect to a computed tomography device. However, those skilled in the art will recognize that the present invention has several applications within the medical imaging field and outside the medical imaging field. That is, the present invention is suitable for applications that employ connections in hard to reach, densely populated circuit boards. The present invention is also suitable for applications in which a connector is to be connected and disconnected often.

Referring now to FIG. 1, a portion of a CT system 10 is illustrated having a data acquisition system 12 and several detector modules 14 coupled together through a plurality of connector assemblies 16. Although a CT system 10 is illustrated, the present invention applies equally to other types of systems requiring a connector assembly.

Data acquisition system 12 includes a circuit board 18 that has a plurality of electrical components and circuit traces thereon and therein.

Each detector module 14 includes a photo diode used for X-ray detection that are electrically coupled to a flex circuit 20. By providing a flex circuit 20 the data acquisition system 12 and detector modules 14 may be easily connected or disconnected at connector assembly 16.

Connector assembly 16 has a back shell 22 and a housing 24. Of course, the number of connectors utilized on a data acquisition 12 depends upon the number of detectors and other physical characteristics of the system.

Figure 2:
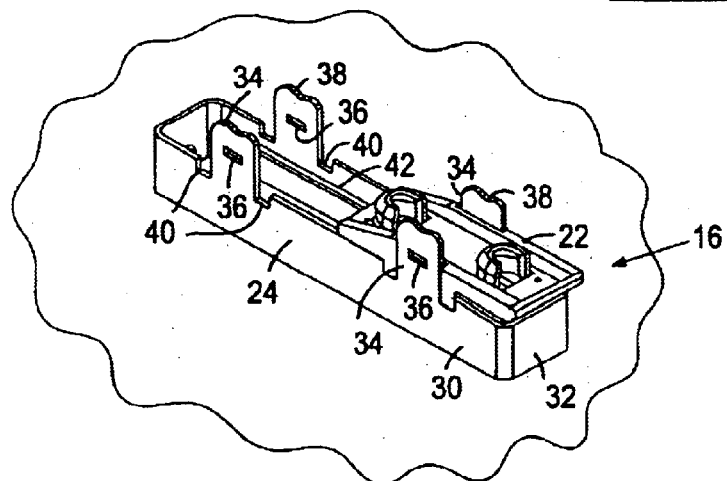
FIG. 2 is a perspective view of a partially assembled circuit according to the present invention.

Referring now to FIG. 2, a housing 24 or first connector portion is shown partially assembled with a second connector portion or back shell 22 with the flex circuit 20 removed for simplicity. As will be further described below, housing 24 is indirectly coupled to circuit board 18. Because the back shell 22 and housing 24 must be connected and reconnected several times during manufacturing and servicing, back shell 22 is easily removed from housing 24. Also, the CT system may be adversely affected by microphonics, leakage and short circuits resulting from contamination of the connection provided by connector 14. The circuit is also highly sensitive to electrostatic discharge and charge induced noise, which is called microphonics. Also, the pins within housing 24 are also susceptible to damage if bent due to forces not parallel to the axis of the pin.

Housing 24 is illustrated as receiving two back shells 22. However, one or more than two may also be accommodated in an appropriately sized housing 24. Housing 24 has longitudinal sides 30 and lateral sides 32. Preferably, the width of lateral side 32 is about the same size as back shell 22.

Housing 24 has a plurality of guide arms 34 extending from the housing on the longitudinal sides upward or outward from circuit board 18. As will be further described below, guide arms 34 are used to guide and retain back shell 22. Arms 34 each have a snap opening 36 for receiving a snap on back shell 22. Preferably, two guide arms 34 are used for each back shell 22. Snap opening 36 preferably extends through the thickness of guide arm 34. Guide arms 34 also include a removal guide 38. Removal guide 38 as illustrated is a U-shaped indention in the top of each guide arm 34. Adjacent to each guide arm 34 in housing 24 a plurality of alignment openings are provided for receiving a portion of back shell 22. As illustrated, two alignment openings 40 are provided on each side of each guide arm 34. Alignment openings 40 also add flexibility to arms 34 to allow easier engagement and disengagement of the two connector portions.

A pair of longitudinal ribs 42 on the inside of longitudinal sides 30 are provided to retain an interposer as will be further described below. Each longitudinal side 30 has a longitudinal rib 42. Longitudinal rib 42 is positioned beneath alignment opening 40 at the position where the substrate is to be positioned.

Figure 3:
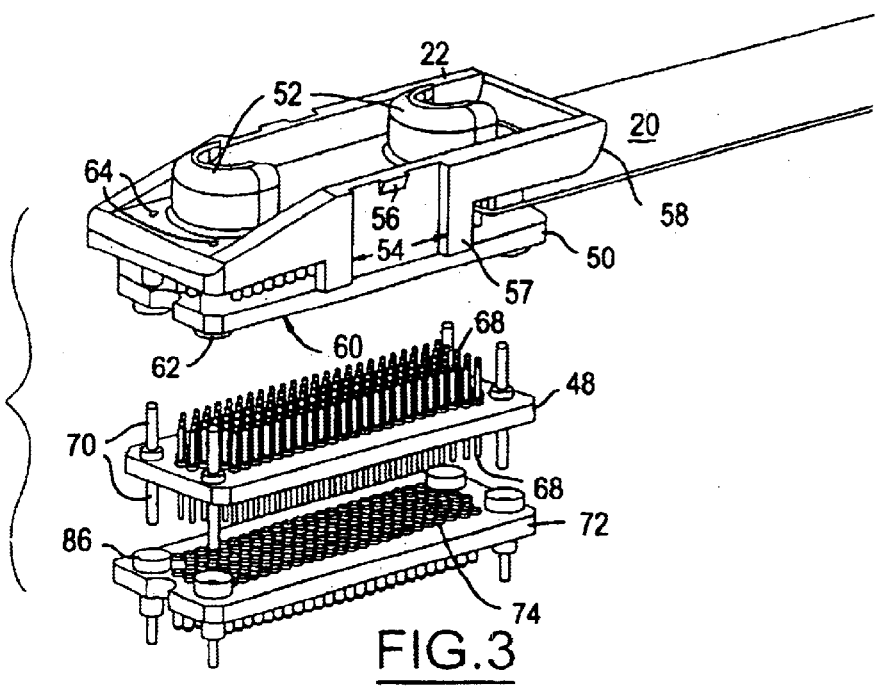
FIG. 3 is a perspective exploded view of a back shell coupled to a flex circuit relative to an interposer and a circuit carrier according to the present invention.

Referring now to FIG. 3, back shell 22 is illustrated with respect to an interposer 48 and a circuit board socket carrier 72. Interposer 48 is electrically coupled to flex circuit 20 through a back shell socket carrier 50.

Back shell 22 includes a removal grip 52. As illustrated, two removal grips 52 are integrally molded to back shell 22. Removal grips 52 are illustrated as slotted cups that are sized to engage a removal tool as will be further described below. A guide channel 54 is provided in each side of back shell 22. Guide channel 54 receives the guide arms 34 of housing 24. Each guide channel 54 has a snap 56 therein. Snap 56 is sized to engage snap opening 36 on guide arms 34.

An alignment key 57 may be included adjacent to each side of each arm 34. Alignment key 57 is sized to be received within a corresponding alignment opening 40.

Back shell 22 includes a rounded end 58 to help bend flex circuit 20 to a desired shape. Thus, rounded end 58 acts as a fixture to bend flex circuit 20 into a proper position without damage thereto. Back shell socket carrier 50 includes a plurality of ball grid array electrical sockets 60 thereon, only one of which is shown for simplicity. Alignment and ground socket 62 may be located at each corner of back shell socket carrier. Alignment and ground socket 62 are larger than socket 60 to provide a guide during assembly. Back shell socket carrier 50 and alignment and ground socket 62 are electrically coupled to flex circuit 20 and to back shell 22 which is formed of an electric charge dissipative material. A connection may be formed through through-holes 64 using a conductive material such as a pin, conductive epoxy, or solder. In one constructive embodiment four through-holes were provided in the top surface of back shell 22. Interposer 48 has a plurality of pins 68 and a plurality of alignment and guide pins 70. Alignment and guide pins 70 align with sockets 62 on back shell socket carrier 50 and on the circuit socket carrier as will be described below. Each pin 68 and 70 correspond to a socket on back shell socket carrier 50. Alignment and ground pin 70 may actually extend into through-holes 64. In one constructed embodiment, 146 pins 68 are provided on interposer 48.

Socket carrier 72 has sockets 74 which when assembled are electrically connected to pins 68. Alignment and ground sockets 86 coupled to pins 70.

Figure 4:
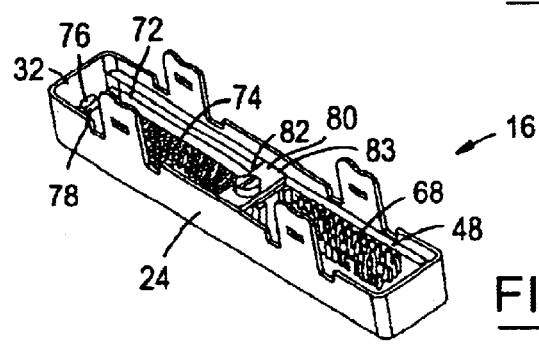
FIG. 4 is a perspective view of a dust shield showing the internal assembly thereof according to the present invention.

Referring now to FIG. 4, a partially assembled connector assembly 16 is illustrated. In this illustration one interposer 48 is positioned within housing 24. Preferably, one interposer is provided for each back shell. Interposer 48 connects to a carrier board or circuit board socket carrier 72 that has a plurality of sockets 74 thereon. Pins 68 of interposer 48 are received within socket 74. An alignment guide 76 formed on lateral side 32 of housing 24 is used to position housing 24 over alignment guide 76. Circuit board socket carrier 72 has an alignment slot 78 that aligns with alignment guide 76. Housing 24 is retained on circuit board 18 through a retainer 80 that is positioned beneath cross-member 83 and a fastener 82. Cross-member is preferably integrally molded into the housing 24. Fastener 82 extends through cross-member 83 and retainer 80.

Figure 5:
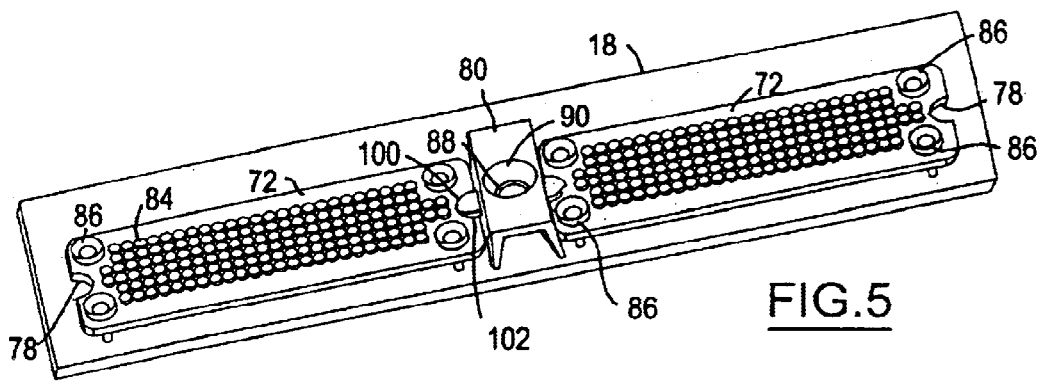
FIG. 5 is a perspective view of a substrate on a data acquisition system.
Figure 6:
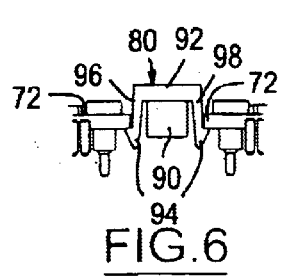
FIG. 6 is a perspective view of a retaining mechanism according to the present invention.
Figure 7:
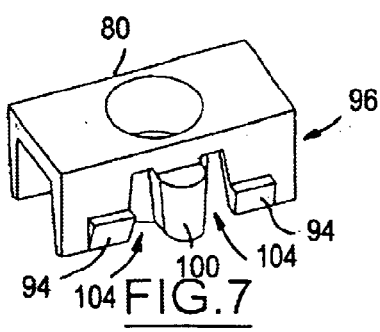
FIG. 7 is a front view of a retaining mechanism according to the present invention.

Referring now to FIGS. 5, 6, and 7, circuit board socket carrier 72 is illustrated positioned on circuit board 80. Circuit board socket carrier 72 has a plurality of sockets 84 that are electrically coupled to traces on circuit board 18. Circuit board socket carrier 72 has a plurality of alignment and ground sockets 86. When the connector is assembled, sockets 84 and 86 are soldered to circuit board 18 in a conventional manner. Retainer 80 is then snapped into place.

Retainer 80 has a thread insert 88 received within a hole 90 through a middle retainer portion 92. The thread insert 88 receives the fastener 82 that is positioned on a cross-member 83 that extends across housing 24. Middle retainer portion 92 is preferably parallel to circuit board 18. A snap 94 is provided on a first retainer sidewall 96 and a second retainer sidewall 98. Snaps 94 prevent the retainer from moving in a vertical direction (outward from circuit board) once inserted into the space between circuit board 18 and socket carrier 72. A restraint 100 is employed on each sidewall 96, 98. Restraint 100 is formed as a rounded portion extending from the sidewall that engages an alignment slot 102 through circuit board socket carrier 72. First retainer sidewall 96 and second retainer sidewall 98 may each have flex slots 104 therein. Flex slots 104 allow a portion of the first retainer sidewall 96 and the second retainer sidewall 98 to flex inward to provide clearance for snaps 94 when the retainer 80 is positioned.

Figure 8:
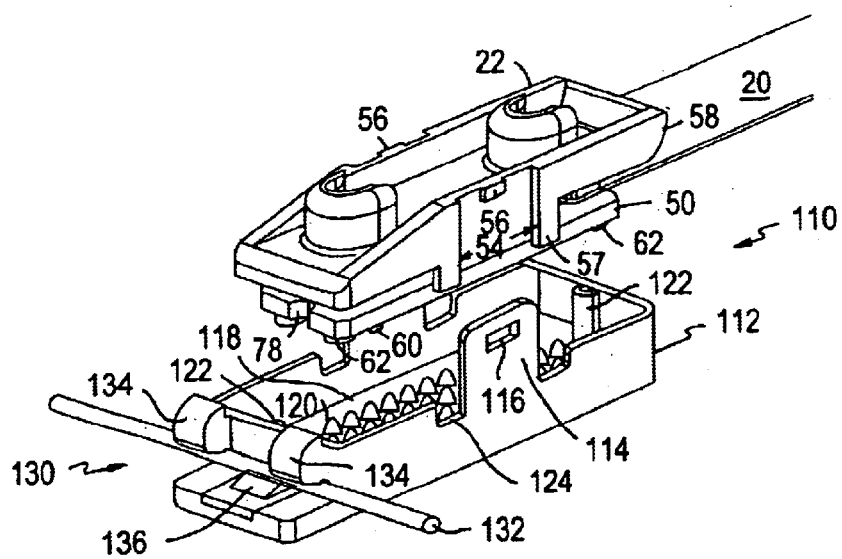
FIG. 8 is a protective boot to be coupled to the back shell according to the present invention.

Referring now to FIG. 8, as mentioned above, the detector and data acquisition circuits are sensitive to contamination and electrostatic discharge. To alleviate this problem a connector cap assembly is illustrated relative to a back shell 22. Once the back shell 22 is disconnected from housing 24, it may be mechanically coupled to connector cap assembly 110. Connector cap assembly 110 has a boot housing 112 that has some similar features to that of housing 24. That is, boot housing 112 has a guide arm 114, a snap opening 116 that engage guide channel 54 and snap 56 on back shell 22. Boot housing 112 preferably has a compliant floor 118 that has a plurality of electrical contacts 120 positioned thereon. Compliant floor 118 and boot housing 112 are preferably formed of an electrically dissipative material. Alignment guides 122 that correspond to the alignment guides 76 and restraint 100. Alignment guides 122 receive alignment slots 78 and 102 on back shell socket carrier 50 allowing boot housing to be a fixture to back shell 22. Boot housing 112 may also include alignment openings 124 that receive alignment key 57 on each side of guide channel 54.

Boot housing 112 includes a retainer 130 for positioning a ground wire 132 therein. Thus, retainer 130 maintains an electrical contact with ground wire 132 to boot housing 112 to slowly bleed any electrostatic build up on housing. Retainer 130 may include two protrusions 134 that extend from boot housing 112. A tab 136 is used to hold ground wire 132 between protrusions 134 and housing 112. Preferably, tab 136 is flexible to allow the ground wire to be easily placed between the tab 136, protrusions 134, and boot housing 112.

Referring back to compliant floor 118, electrical contacts 120 are illustrated as pyramidal shapes. One contact is provided for every four sockets. That is, the pyramid has four sides, each side contacting a respective socket. Electrical contacts 122 may thus dissipate any electrostatic buildup within flex circuit 20 or socket 60 through the boot housing 112 and ultimately through ground wire 132.

In operation, the connector assembly 16 is formed by first mounting the circuit board socket carriers 72 to circuit board 18. Each of the sockets 84, 86 are soldered to the circuit board so that they are fixedly attached thereto. Retainer 80 is then snapped into place so that snaps 94 engage the bottom surface of the substrate of the circuit board socket carrier 72. The restraints 100 engage alignment slots 102 in the circuit board socket carrier 72 so that horizontal movement of the retainer is prevented. The connector housing 24 is then placed over the circuit board socket carrier 72 so that the alignment guides 76 align with alignment slot 78. Also, the cross-member 83 is aligned with retainer 80 so that fastener 82 extends into and engages thread insert 88.

The interposer 48 is then placed upon the circuit board socket carrier 72 so that the pins align with the appropriate sockets.

Flex circuit 20 is connected to the sockets 60, 62 of back shell socket carrier 50. Conductive material may be placed in through-holes 64 so that alignment and ground socket 62 are electrically coupled to the back shell 22. The flex circuit 20 and sockets are coupled together in a conventional manner such as by soldering. The sockets of back shell socket carrier 50 along with back shell 22 are then aligned so that guide arms 34 are placed within guide channel 54. The back shell 22 is then forced in a vertical direction toward circuit board 18 until snap 56 engages snap opening 36.

Figure 9:
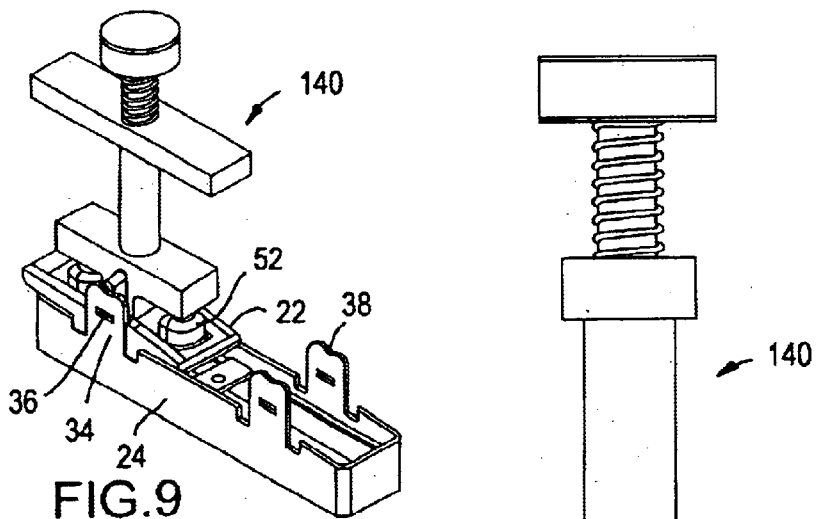
FIG. 9 is a perspective view of a connection extraction tool in use according to the present invention.

Referring now to FIG. 9, a back shell extraction tool 140 is shown engaged with removal grip 52 of back shell 22. Extraction tool 140 provides a force perpendicular to the plane of the circuit board to prevent the pins from being damaged. Also, extraction tool 140 provides an outward pressure on guide arms 34 to flex the guide arms outward so that snaps 56 disengage snap openings 36.

Figure 10:
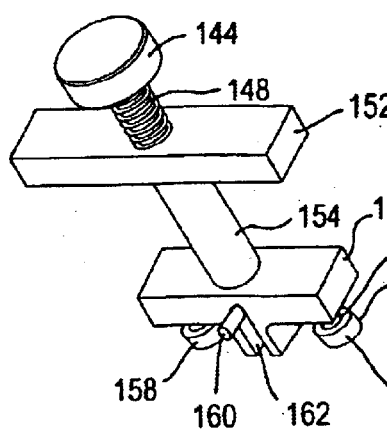
FIG. 10 is a perspective view of the extraction tool alone.

Referring now to FIGS. 10 and 11, extraction tool 140 includes a piston assembly 141 that includes piston 142 that has a handle 144 attached thereto. Piston 142 also has a channel 146 at the end opposite handle therethrough. Piston assembly 141 includes spring 148 that is received on piston 142. Piston 142 is inserted within a channel 150 within grip 152. Piston 142 is slidably received within a sleeve 154 that is also part of the piston assembly 141. Piston 146 extends through sleeve 154 through a cross-member 156. Cross-member 156 has two post heads 158 extending therefrom. Post heads 158 are used to engage removal grip 52 on back shell 22. A pin 160 is received within channel 146 in piston 142. As will be further described below, pin 160 is preferably angled. Pin 160 is receiving within a slot 162 that extends vertically from the bottom of cross-member 56.

Spring 148 biases handle 144 and thus piston 142 in an upward position so that pin 160 is in the uppermost position of slot 162. For removal of back shell 22, pin 160 is placed within removal guide 38. Pin 160 flexes the guide arms 134 outward so that snap 56 disengages snap opening 36. The post heads 158 engage the removal grips 52 so that extraction may be made perpendicular to the surface of the circuit board. Extraction is made by overcoming the spring bias and bringing handle 144 closer to grip 152. Typically the thumb or palm of a hand will engage handle 144 while the first two fingers engage each side of grip 142.

Post heads 158 have a wide diameter cylindrical portion 164 and a mounting post 166.

Figure 12:
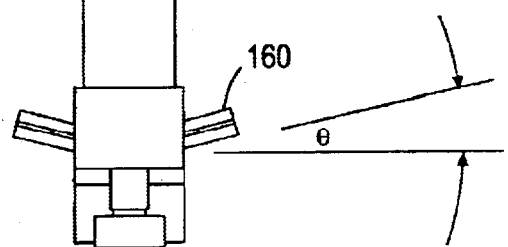
FIG. 12 is an enlarged view of the pin with the extraction tool according to the present invention.
Figure 18:
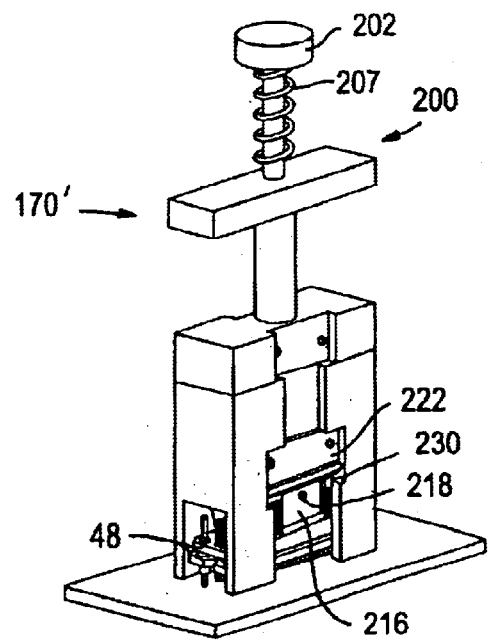
FIG. 18 is a side view of a first position of the second embodiment of the interposer extraction tool.
Figure 19:
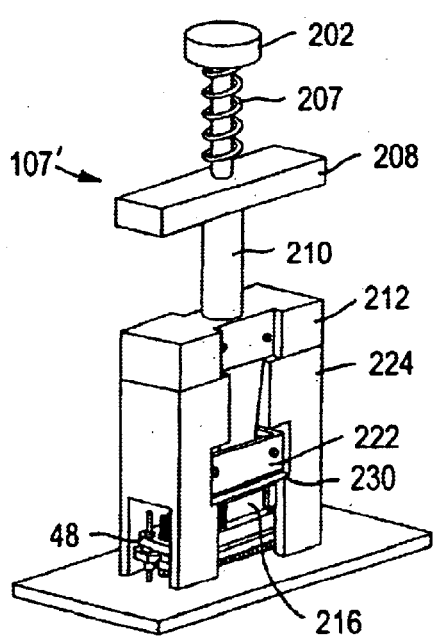
FIG. 19 is a side view of the second embodiment of the extraction tool in a second position according to the present invention.

Referring now to FIG. 12, pin 160 is preferably angled or slightly U-shaped. Pin 160 has an angle θ with respect to the horizontal axis or the axis of piston 162. Angle θ is preferably less than 90 degrees and more preferably 15 degrees. This angle allows pin 160 to provide outward pressure on guide arms 34 so that snap 56 disengages snap opening 36.

Referring now to FIGS. 13, 14, and 15, once the back shell 22 is disconnected from housing 24, the interposer 48 may be removed. It is important to remove the interposer in a manner perpendicular to the circuit board or parallel to the direction of the pins on the interposer. It is also important to capture the interposer so that it does not fall into an undesirable location within the system from which it is removed.

An interposer extraction tool 170 has a piston assembly 171 that includes a piston 172 that has a grip handle 174 thereon. Piston 172 is received within a handle 176 so that they move relative to each other. A pair of springs 178 and 180 bias the piston 172 upward. Grip handle 176 has a pair of blades 182 attached thereto. Blades 182 have an end portion that are parallel to the plane of the interposer. Blades 182 are normally biased outward so that end portion 184 may be positioned parallel to and beneath the interposer 48. A cross-member 186 and pair of blocks 188 are fixed to piston 172. Blocks 188 are used to compress blades 182 to engage the interposer 48. Spring 180 is connected to a guide block 190 that is coupled to piston 172. Guide block 190 forms a channel 191 therein. Channel 191 is formed between fingers 194 extending downward from guide block 190. The fingers 194 and thus channel 191 retain the interposer 48 after extraction. For extraction, two motions result. A downward motion of the piston 172 closes the blades 182 between the bottom of the interposer 48 and the top of board mounted socket carrier 72. Second, an upward motion of the grip handle 176 pulls the blades 182 upward forcing the interposer 48 to disengage from the board mounted socket carrier 72 and eventually lock against stop 192. The wedging of the interposer 48 against the stop 192 captures the interposer within the removal tool. Typically, the handle 174 of piston 172 will rest against the palm while the handle 176 is gripped by two fingers in the same hand.

Referring now to FIGS. 16, 17, 18, 19, and 20, a second embodiment of interposer extraction tool 170' is illustrated. Extraction tool 170' has a piston assembly 200 that has a grip handle 202 on a first end of a plunger 204. The second end of plunger 204 has a channel 206 coupled thereto. As illustrated, the second end of plunger 204 is threaded in to channel 206. Thus, as plunger moves, channel 206 moves accordingly. Channel 206 is similar to the channel described above in the previous embodiment. Piston assembly 200 also has a spring 207 thereon.

Piston assembly 200 is slidably received within a handle assembly 209 that includes a handle 208, a sleeve 210, and a block 212. Spring 207 is coupled to plunger 204 between grip handle 202 and handle 208. Handle 208, sleeve 210, and block 212 move together and are guided by guide pins 214. Handle assembly 209 has blades 216 coupled to each side thereof. Blades 216 have a bump 218 that allows the blade to be biased inward as will be further described below. Blades 216 have a grip portion 220 that is used to grip the interposer therein.

Channel 206 has a biasing member 222 fixably attached thereto. Blades 216 are slidably received between channel 206 and biasing member 222. As bump 218 is positioned adjacent to biasing member 222 by movement of the piston assembly 200, the grip portion 220 of blades 216 are moved inwardly about the interposer.

The plunger assembly 200 is also received within a guide block 224. Guide block 224 has a channel 226 that slidably receives blade 216. The channel 206 moves only a predetermined distance since biasing member 222 can only move within opening 228 and stops in a vertically downward position by stop 230.

Figure 20:
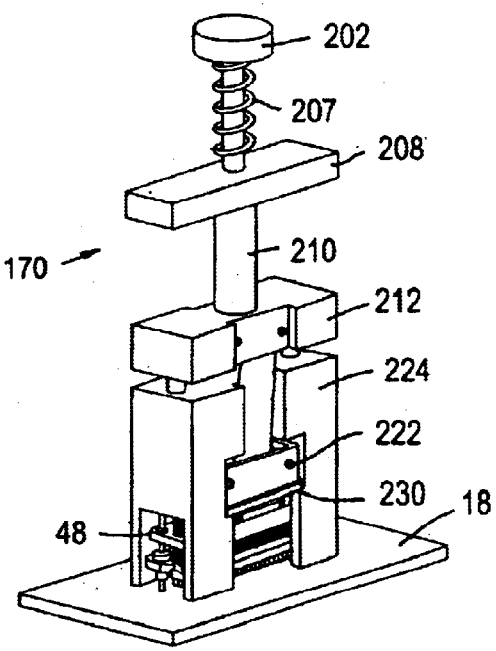
FIG. 20 is a perspective view of the second embodiment of the extraction tool when the interposer is extracted.

In operation, the plunger assembly 200 is moved from an upward position (FIG. 18) to a downward position (FIG. 19) so that channel 206 engages the interposer. In FIG. 20, the blades position interposer 48 against channel 206. Blades 218 move inwardly when the bump 218 engages biasing member 222. The biasing member 222 physically pushes the blades inward. The handle 208 is moved vertically upward so that the interposer is captured between the channel 206 and the grip portion of the blades 220. Biasing member 222 acts as a compression member to compress the blades inward. Once the interposer is gripped between channel 206 and the blade, the tool may be removed from the system and the interposer may be dislodged from the device.

While the invention has been described in connection with one or more embodiments, it should be understood that the invention is not limited to those embodiments. On the contrary, the invention is intended to cover all alternatives, modifications, and equivalents, as may be included within the spirit and scope of the appended claims.

What is claimed is:

1. A tool for separating a first circuit board and a second circuit board comprising:

a piston assembly having a grip handle and a channel having a biasing member coupled thereto;

a handle assembly having a handle, a first block, a first blade and a second blade, said handle assembly slidably coupled to said piston assembly, said first blade and said second blade coupled to said first block, said first and said second blade biased outwardly, said first blade and said second blade each having a bump thereon;

said handle assembly having a first position and a second position relative to said piston assembly, in said first position said first blade and said second blade being biased outwardly and in said second position said biasing member of said piston assembly engaging said bump of each blade and biasing said first blade and said second blade inwardly to engage the first circuit board.

2. A tool as recited in claim 1 further comprising a first spring positioned on said piston between said handle and said grip handle.

3. A tool as recited in claim 1 wherein said channel is coupled to a second end of said piston assembly.

4. A tool as recited in claim 1 further comprising a guide block slidably coupled to said piston assembly.

5. A tool as recited in claim 1 wherein said blades extend between said guide block and said biasing member.

* * * * *